(12) United States Patent
Katiyar et al.

(10) Patent No.: US 8,803,264 B1
(45) Date of Patent: Aug. 12, 2014

(54) ROOM-TEMPERATURE MAGNETOELECTRIC MULTIFERROIC THIN FILMS AND APPLICATIONS THEREOF

(75) Inventors: Ram S Katiyar, Guaynabo, PR (US); Ashok Kumar, San Juan, PR (US); James F Scott, Cambridge (GB)

(73) Assignee: University of Puerto Rico, San Juan, PR (US)

( * ) Notice: Subject to any disclaimer, the term of this patent is extended or adjusted under 35 U.S.C. 154(b) by 659 days.

(21) Appl. No.: 13/118,275

(22) Filed: May 27, 2011

Related U.S. Application Data

(60) Provisional application No. 61/348,895, filed on May 27, 2010.

(51) Int. Cl.
H01L 29/82 (2006.01)

(52) U.S. Cl.
USPC ............ 257/421; 257/E21.002; 257/E23.323; 438/3

(58) Field of Classification Search
USPC ................ 257/421, E21.002, E29.323; 438/3
See application file for complete search history.

*Primary Examiner* — Marvin Payen
(74) *Attorney, Agent, or Firm* — Hoglund & Pamias, P.S.C.; Roberto J. Rios

(57) ABSTRACT

The invention provides a novel class of room-temperature, single-phase, magnetoelectric multiferroic $(PbFe_{0.67}W_{0.33}O_3)_x$ $(PbZr_{0.53}Ti_{0.47}O_3)_{1-x}$ $(0.2 \leq x \leq 0.8)$ $(PFW_x-PZT_{1-x})$ thin films that exhibit high dielectric constants, high polarization, weak saturation magnetization, broad dielectric temperature peak, high-frequency dispersion, low dielectric loss and low leakage current. These properties render them to be suitable candidates for room-temperature multiferroic devices. Methods of preparation are also provided.

31 Claims, 14 Drawing Sheets

ROOM-TEMPERATURE MAGNETOELECTRIC MULTIFERROIC THIN FILMS AND APPLICATIONS THEREOF

GOVERNMENT INTEREST

The claimed invention was made with U.S. Government support under grant numbers W911NF-05-1-0340, W911NF-06-1-0030, and W911NF-06-1-0183 awarded by the Department of Defense (DOD) and grant number FG 02-08ER46526 awarded by the Department of Energy (DoE). The government has certain rights in this invention.

BACKGROUND OF THE INVENTION

The development of practical magnetoelectric (ME) multiferroic devices for industry is concentrated on two embodiments: The first is for weak-field sensors for applications such as mine detection in harbors or related military devices. In this case practical devices favor sandwich-type bilayer or multilayer composites of ferroelectrics such as lead zirconate-titanate (PZT) with magnets such as terphenyl-d but this configuration yields low ME voltage coefficients which is not suitable for weak field sensor applications. The second is for random access memory elements where the ability to switch magnetization with applied electric fields (and vice versa) would permit the combination of fast (possibly sub-nanosecond) WRITE operation with nondestructive magnetic READ operation. Such a combination would produce formidable competition for FLASH EEPROMs, particularly in view of the fact that magnetoelectric RAMs would operate at <1.0V, an international target for all microelectronics in the next decade which FLASH devices are unlikely to meet without cumbersome internal charge pumps.

However, most multiferroics to date (such as terbium manganites $TbMnO_3$ or $TbMn_2O_5$) switch only $nC/cm^2$ with applied magnetic fields—approximately 1000× too small for reliable discrimination between "1" and "0" states. Moreover, they operate only at cryogenic temperatures. $BiFeO_3$ might operate at room temperature, but it exhibits a weak magnetism (ca. 0.03 emu/cc), high leakage current, and it does not permit switching of neither magnetization with electric fields nor polarizations with magnetic fields. There are several other magnetically frustrated systems that have been identified which show gigantic magnetoelectric effects at low temperature. Among them, $MnWO_4$ shows external magnetic field dependence of its ferroelectric loops below room temperature. Similarly, high-temperature multiferroic behavior has been reported in $PbFe_{0.5}Ti_{0.5}O_3$ and in $PbFe_{2/3}W_{1/3}O_3$/$PbTiO_3$. Others have studied the relaxor properties of PFW and PFW-PT ceramics.

Clearly a new line of thinking is required to overcome the intrinsic limitations of direct linear magnetoelectric (ME) coupling of form PM in the free energy, where P is polarization and M, magnetization. There have been recent efforts by researchers throughout the world to produce electric switching of magnetizations or magnetic switching of polarizations in multiferroic magnetoelectrics. Generally, schemes for switching from +M to −M with electric field (E) or conversely from $+P_r$ to $-P_r$ with magnetic field (H) have been examined. In the present state of the art there is a need for a new single-phase material that can exhibit magnetoelectricity (not necessarily linear) at room temperature.

SUMMARY OF THE INVENTION

The present invention provides a novel class of magnetoelectric multiferroic compositions that have a room-temperature magnetic switching of large electric polarizations with high memory window in MMIS structure paving way for non-volatile memory applications.

According to an aspect of the invention, a novel class of room-temperature, single-phase, magnetoelectric multiferroic $(PbFe_{0.67}W_{0.33}O_3)_x$ $(PbZr_{0.53}Ti_{0.4703})_{1-x}$ ($0.2 \leq x \leq 0.8$) ($PFW_x$–$PZT_{1-x}$) thin films are provided that exhibit high dielectric constants (1200-3000), high polarization (22-60 $\mu C/cm^2$), weak saturation magnetization (0.48-4.53 emu/$cm^3$), broad dielectric temperature peak, high-frequency dispersion, low dielectric loss and low leakage current.

According to a further aspect of the invention, the inventive films are suitable for room-temperature multiferroic devices. Near 20% of PFW, the ferroelectric relaxor state is nearly unstable at room temperature against long-range ferroelectricity which in turn gives a large magnetoelectric effect: switching not from +Pr to −Pr with applied H, but from Pr to zero with applied H of less than a Tesla.

According to another aspect of the invention, a Metal Multiferroic Insulator Semiconductor (MMIS) device structure is provided on Pt/($PFW_x$–$PZT_{1-x}$)($0.2 \leq x \leq 0.4$)/$SrTiO_3$(6 nm)/Si (111) substrate showing a well behaved and saturated C(V) hysteresis with 3-4 V memory window, and low leakage current density ($10^{-8}$-$10^{-6}$ $A/cm^2$) @ 150 kV/cm.

According to one aspect of the invention, the synthesis and fabrication of a novel class of room temperature, single-phase, magnetoelectric multiferroic thin films of composition ($PFW_x$-$PZT_{1-x}$)($0.2 \leq x \leq 0.8$) is provided showing magnetic control of large polarization (~22-60 $\mu C/cm^2$) merely less than a Tesla.

According to another aspect of the invention, the method of fabricating magnetoelectric multiferroics of composition ($PFW_x$-$PZT_{1-x}$) ($0.2 \leq x \leq 0.8$) that exhibit high dielectric constants, weak saturation magnetization, broad dielectric temperature peak, high-frequency dispersion, low dielectric loss and low leakage current is provided.

According to still another aspect of the invention, ($PFW_x$-$PZT_{1-x}$) composite thin films are provided, where x=0.20; exhibiting a giant polarization of 60 $\mu C/cm^2$, moderate magnetization 6-8 emu/cc, and a high piezoelectric coefficient at room temperature.

According to one aspect of the invention, a method of fabricating ($PFW_x$–$PZT_{1-x}$) (x=0.20) composite thin films that switch large polarizations from 22 $\mu C/cm^2$ to 0 $\mu C/cm^2$ under the application of 0.5 Tesla is provided.

According to another aspect of the invention, the device incorporating the above films permit 3-state logic ($+P_r$, O, $-P_r$) and a condenser with >5000% magnetic field change in its capacitance; in H=0 the coercive voltage is 1.4 V across 300 nm for $+P_r$ to $-P_r$ switching, and the coercive magnetic field is 0.5 T for $+P_r$ to zero switching.

According to a further aspect of the invention, a method of fabricating ($PFW_x$–$PZT_{1-x}$) (x=0.20) composite thin films in which increasing magnetic field lengthens the relaxation time by ×500 from <200 ns to >100 $\mu s$ is provided, wherein it strongly couples the polarization relaxation and spin relaxations.

According to one aspect of the invention, it provides a family of room-temperature, magnetoelectric mutiferroic devices fabricated and designed by tailoring compositions of ($PFW_x$–$PZT_{1-x}$) ($0.2 \leq x \leq 0.8$) at the "B-site" that show high dielectric constant, low dielectric loss, diffused ferroelectric phase transition, low leakage current and high temperature dependent dielectric tunability.

According to another aspect of the invention, a memory device structure incorporating the ($PFW_x$-$PZT_{1-x}$) ($x=0.20 \leq x \leq 0.80$) composite and a method of fabrication of such device is provided.

According to still another aspect of the invention, a ($PFW_x$-$PZT_{1-x}$) ($x=0.20 \leq x \leq 0.80$) composite that is used in microelectronic applications in the form of magnetic field sensors, and capacitors is provided.

According to a further aspect of the invention, a MMIS device structure of Pt($PFW_x$-$PZT_{1-x}$)/$SrTiO_3$/Si (111) is provided, fabricated for different compositions of ($PFW_x$-$PZT_{1-x}$) ($x=0.20 \leq x \leq 0.60$), showing well behaved and saturated C(V) hysteresis with 3-4 V memory windows, and low leakage and serving as excellent candidates for non-volatile memory applications and multiferroic RAMs.

BRIEF DESCRIPTION OF THE DRAWINGS

Further features and advantages of the invention will become apparent from the following detailed description taken in conjunction with the accompanying figures showing illustrative embodiments of the invention, in which.

Figure 1:
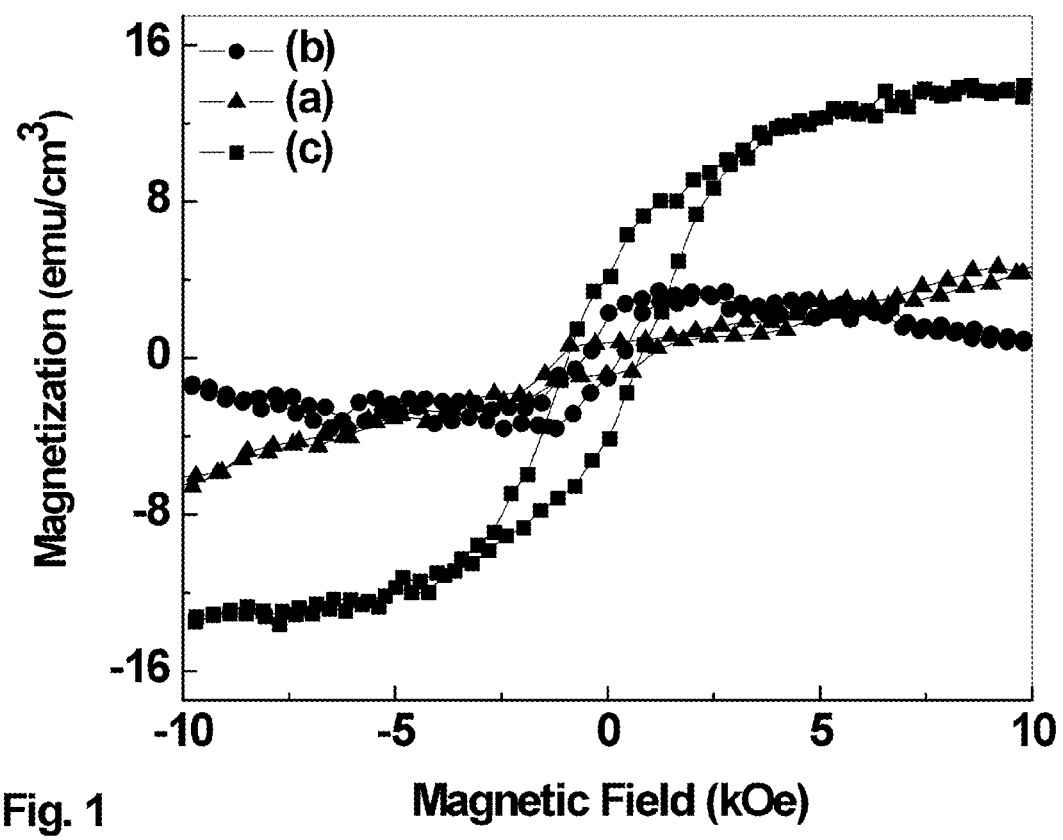
FIG. 1 shows a plot of Room temperature magnetization versus magnetic field (M-H) response of the ($PFW_x$-$PZT_{1-x}$) ($x=0.20$ (a), $x=0.30$ (b), and $x=0.40$ (c)) thin films, according to the present invention.

Throughout the figures, the same reference numbers and characters, unless otherwise stated, are used to denote like elements, components, portions or features of the illustrated embodiments. The subject invention will be described in detail in conjunction with the accompanying figures, in view of the illustrative embodiments.

DETAILED DESCRIPTION OF THE INVENTION

The present invention relates to a novel room-temperature, single-phase, magnetoelectric multiferroic structure of composition $(PbFe_{0.67}W_{0.33}O_3)_x$ $(PbZr_{0.53}Ti_{0.47}O_3)_{1-x}$ where, $0.2 \leq x \leq 0.8$. All the terms used have the same meaning as is used in general aspect of the art, unless otherwise specified. As used hereinafter, the following terms shall have the following definitions: "Magnetoelectric" refers to the effect of induced dielectric polarization of a material in an applied magnetic field or an induced magnetization in an external electric field; "Piezoelectricity" refers to the ability of materials to generate an electric field in response to an applied mechanical force; "Relaxor" refers to materials having naturally occurring short-range polar nano-ordered regions and highly frequency-dependent dielectric properties; "Remanent polarization, $P_r$," refers to the spontaneous polarization under the application of external field of zero bias; "Coercive E-field," $E_c$ refers to the electric field which is used to switch the polarization to generate the different logic state for memory applications. The E-field frequency is 50 Hertz for the purpose of this description; "$E_{max}$," refers to the maximum electric field that is used for the hysteresis loop measurements; "Leakage current density" (J") refers to the current per unit area, measured as function of applied electric field; "Polarization fatigue $P_{sw}$" refers to the loss in polarization after certain number of cycles of device utility; "B-site": The general formula for perovskite oxides is $ABO_3$, where specific elements occupy the A and B sites in the crystal lattice, and O is oxygen. For ($PFW_x$-$PZT_{1-x}$), Pb is on the A-site and Zr, Ti, Fe, and W share the B-site; "Room temperature" refers to a temperature of 296 K.; "Positive temperature coefficient of resistivity" refers to the increase in resistance with increase in temperature; "Negative differential resistivity" refers to the decrease in resistance with increase in applied external voltage.

The composite $(PbFe_{0.67}W_{0.33}O_3)_x$ $(PbZr_{0.53}Ti_{0.47}O_3)_{1-x}$ is referred to as $PFW_x$-$PZT_{1-x}$ throughout this description. The present invention provides a class of single-phase, magnetoelectric multiferroic materials comprising at least one piezoelectric/ferroelectric composition and one magnetic/ferroelectric relaxor composition, wherein the piezoelectric/ferroelectric composition is PZT and the magnetic/ferroelectric relaxor composition is PFW.

The invention provides a composite $(PbFe_{0.67}W_{0.33}O_3)_x$ $(PbZr_{0.53}Ti_{0.4703})_{1-x}$ where, $0.2 \leq x \leq 0.8$ that exhibits ferroelectricity, piezoelectricity and (weak) ferromagnetism above room temperature with magneto-electric coupling via strain mediated electrostriction and magnetostriction. The composite exhibits a wide range of unique properties including but not limited to room temperature magnetic switching of large electric polarizations; remanent polarization in the range of 22-60 $\mu C/cm^2$; dielectric loss in the range of 1-5%; high dielectric constant in the range of 1200-3000; and a weak saturation magnetization. The invention also provides a ($PFW_x$-$PZT_{1-x}$) ($x=0.20 \leq x \leq 0.80$) composite that exhibits a weak saturation magnetization in the range of 0.48-4.53 emu/ cm$^3$ that shows an increase of 15 emu/cm$^3$ with increase in Fe and W compositions. A preferred embodiment of the present invention provides a composite (PbFe$_{0.67}$W$_{0.33}$O$_3$)$_{0.2}$ (PbZr$_{0.53}$Ti$_{0.47}$O$_3$)$_{0.8}$ that exhibits a giant polarization of 60 µC/cm$^2$, moderate magnetization 6-8 emu/cc, a high piezoelectric coefficient at room temperature, and a positive temperature coefficient of resistivity and a negative differential resistivity.

Another embodiment of the invention provides a (PFW$_x$–PZT$_{1-x}$) (x=0.20≤x≤0.80) composite that is used in microelectronic applications as magnetic field sensors, and capacitors. The composite exhibits remarkable change in capacitance >5000% under the application of small magnetic field (0.5 T) rendering it suitable for use as magnetic field sensor and capacitor.

The invention provides a chemical solution method of fabricating a thin film of composite (PbFe$_{0.67}$W$_{0.33}$O$_3$)$_x$ (PbZr$_{0.53}$Ti$_{0.47}$O$_3$)$_{1-x}$ where, 0.2≤x≤0.8. The method is carried out by providing a platinized silicon substrate; spin coating a (PFW$_x$–PZT$_{1-x}$) solution on said substrate; pyrolyzing the spin coated substrate at a temperature in the range of 673-773 K; and repeating the steps of spin coating and pyrolyzing to obtain a film having thickness in the range of 300-500 nanometers. In a preferred embodiment of the invention, the platinized silicon substrate is a Pt/TiO$_2$/SiO$_2$/Si(100) layered substrate. In this chemical solution method, high purity (>99.9%) precursor materials, lead acetate trihydrate, iron 2-4 pentanedieonate, titanium isopropoxide, zirconium isopropoxide and tungsten isopropoxide are used to prepare the (PFW$_x$-PZT$_{1-x}$) solution of concentration in the range of 0.2-0.3 moles per liter. The invention provides a chemical solution method of fabricating a thin film of composite (PFW$_x$–PZT$_{1-x}$) (0.2≤x≤0.8) that further includes the step of rapid thermal annealing at temperatures in the range of 873-1023 K for a time period in the range of 60-300 seconds. Rapid thermal annealing is first carried out at a temperature of 973 K for 30 seconds followed by annealing at 923 K for 150 seconds.

The invention can be alternatively carried out by a pulsed laser method of fabricating a thin film of composite (PFW$_x$–PZT$_{1-x}$) (0.2≤x≤0.8). The method comprises providing ceramic targets of (PFW$_x$–PZT$_{1-x}$) (0.20≤x≤0.80); depositing a (PFW$_x$–PZT$_{1-x}$) (0.20≤x≤0.80) layer from the ceramic target on a substrate; annealing the deposited (PFW$_x$–PZT$_{1-x}$) (0.20≤x≤0.80) layer at 873 K for 30 minutes in oxygen at a pressure of 300 Torr; and cooling the annealed layer to 296 K at a rate of 5 K per min.

The invention also provides a pulsed laser method of fabricating a thin film of composite (PFW$_x$–PZT$_{1-x}$) (0.20≤x≤0.80), wherein the composite layer is deposited from the ceramic target to the substrate at a temperature of 873 K under an oxygen pressure of 200 mTorr, using a laser energy density in the range of 1.0-1.5 J/cm$^2$ at a repetition rate of 5-10 Hz. The substrate is MgO (100), (LaAlO$_3$)$_{0.3}$—(Sr$_2$AlTaO$_6$)$_{0.7}$ (100) or SrTiO$_3$. The substrate is covered with a conducting layer of La$_{0.67}$Sr$_{0.33}$CoO$_3$ (LSCO) having a thickness in the range of 60-90 nm. The total thickness of the film is at least 350 nm.

All the composites having composition (PbFe$_{0.67}$W$_{0.33}$O$_3$)$_x$ (PbZr$_{0.53}$Ti$_{0.47}$O$_3$)$_{1-x}$ wherein, 0.2≤x≤0.8 prepared by the pulsed laser method are weakly ferromagnetic and ferroelectric at some temperature, but the increasing amounts of PZT raises the relaxor-to-ferroelectric phase transition from about 150K at 60% to 300K at 80%, so the 80% PZT specimens combine the most interesting properties at ambient temperatures. They exhibit well saturated hysteresis loops with high remanent polarization (P$_r$) of about 55-35 µC/cm$^2$ at an external electric field of 550 kV/cm at room temperature; the remanent polarization decrease with increasing Fe and W compositions. Further enhancement in the Fe and W compositions magnetic Neel's temperature and Curie temperature (ferroelectric phase transition temperature) come near to room temperature which is best for magnetoelectric device fabrication.

The magnetic hysteresis loops of composites with 20% PFW, 30% PFW, and 40% PFW is shown in FIG. 1. The M-H data display weak ferromagnetism. The induced magnetization for (PFW$_x$–PZT$_{1-x}$) was 5 emu/cc at a high magnetic field of 1.5 T; up to this external magnetic field the M-H curve for 20% PFW shows an unsaturated loop with a low saturation magnetization (M$_s$~0.48 emu/cc) and a low coercive field (H~0.12 T), but at 40% the saturation is better and M$_s$=4.5 emu/cc. A super-exchange in the disordered regions through Fe$^{+3}$—O—Fe$^{+3}$ is expected to yield antiferromagnetic ordering but at the low Fe concentrations in this material, weak ferromagnetism is probably caused by spin clustering.

A preferred embodiment of the present invention provides a single-phase tetragonal composite (PbZr$_{0.53}$Ti$_{0.47}$O$_3$)$_{1-x}$ (PbFe$_{0.67}$W$_{0.33}$O$_3$)$_x$ (0.2≤x≤0.4) prepared by the chemical solution and pulsed laser methods onto Pt/TiO$_2$/SiO$_2$/Si(100) and SrTiO$_3$/Si substrates.

The present invention provides a memory device structure that includes at least one layer of the composite (PbFe$_{0.67}$W$_{0.33}$O$_3$)$_x$ (PbZr$_{0.53}$Ti$_{0.47}$O$_3$)$_{1-x}$ wherein, 0.2≤x≤0.8, preferably 0.2≤x≤0.6, more preferably 0.2≤x≤0.4; that is sandwiched or layered between at least one layer of a high-k dielectric material and a metal electrode. The invention can be embodied in a non-volatile memory device structure that includes at least one layer of the composite (PbFe$_{0.67}$W$_{0.33}$O$_3$)$_x$ (PbZr$_{0.53}$Ti$_{0.47}$O$_3$)$_{1-x}$ wherein, 0.2≤x≤0.8, preferably 0.2≤x≤0.6, more preferably 0.2≤x≤0.4; that is sandwiched or layered between at least one layer of a high-k dielectric material and a metal electrode. The layer of high-k dielectric material is selected from a group comprising SrTiO$_3$, HfO$_2$, DyScO$_3$, and LaGdO$_3$ and the metal electrode is Pt or Au. The thickness of the high-k dielectric layer is in the range of 2-8 nm. The memory device structure displays a memory window ranging from 2-4 V and a low leakage current density in the range of 10$^{-9}$ to 10$^{-6}$ A/cm$^2$.

The invention provides a method of fabricating a memory device structure that includes the steps of providing a p-type Si substrate; depositing at least one layer of high-k dielectric material on the substrate, wherein the dielectric layer is 2-8 nm thick; and depositing at least one layer of composite (PbFe$_{0.67}$W$_{0.33}$O$_3$)$_x$ (PbZr$_{0.53}$Ti$_{0.47}$O$_3$)$_{1-x}$ where, 0.2≤x≤0.8, on the said dielectric layer, wherein the composite layer is 350 nm thick. The high-k dielectric material is selected from a group including but not limited to SrTiO$_3$, HfO$_2$, DyScO$_3$, and LaGdO$_3$. The layer of dielectric material has a thickness in the range of 2-8 nm and it is deposited on the p-type Si substrate by pulsed laser deposition at a temperature in the range of 973-1073 K in an oxygen atmosphere at a pressure in the range of 50-100 mT. In a preferred embodiment of the invention, the step of depositing a layer of the composite (PbFe$_{0.67}$W$_{0.33}$O$_3$)$_x$ (PbZr$_{0.53}$Ti$_{0.47}$O$_3$)$_{1-x}$ where, 0.2≤x≤0.8 on the dielectric layer, comprises: irradiating the composite layer with a laser radiation under an oxygen pressure of 200 mTorr at a temperature of 600° C.; annealing the irradiated composite layer at a temperature of 873 K for 30 min under an oxygen pressure of 300 Torr; and cooling to room temperature at a rate of 5 K/min.

The invention also provides room-temperature, single-phase, magnetoelectric multiferroic (PFW$_x$–PZT$_{1-x}$)

(0.2≤x≤0.8) thin films for non-volatile memory applications in FERAMS. A preferred embodiment of the invention provides a room-temperature, single-phase, magnetoelectric multiferroic (PFW$_x$-PZT$_{1-x}$) (0.2≤x≤0.6) thin films for non-volatile memory applications in FERAMS.

Figure 12:
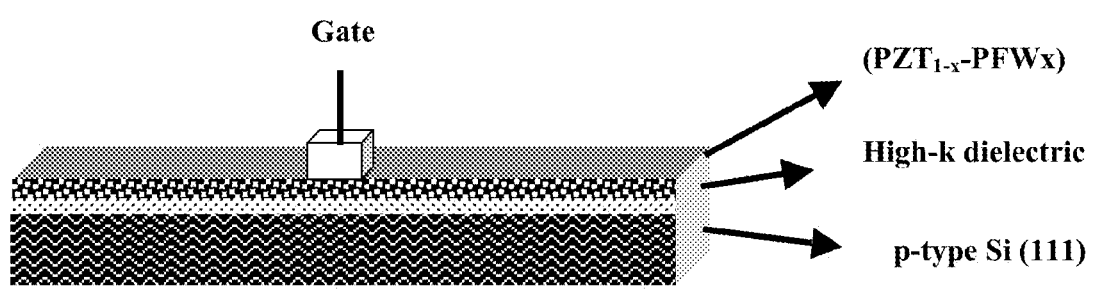
FIG. 12 shows a schematic diagram of a fabricated MMIS device structure, according to the present invention.

FIG. 12 shows a memory device according to an embodiment of the invention. The memory device comprises a p-type Si substrate deposited with at least one layer of (PFW$_x$-PZT$_{1-x}$)(0.2≤x≤0.6) composite; at least one layer of high k-dielectric material, wherein the high-k dielectric material is selected from a group including but not limited to SrTiO$_3$, HfO$_2$, DyScO$_3$, and LaGdO$_3$.

The composite (PFW$_x$-PZT$_{1-x}$) (0.20≤x≤0.80) of the present invention have high potential for non-volatile memory and multiferroic RAM applications.

EXAMPLE 1

Preparation and Properties of (PFW$_x$-PZT$_{1-x}$) (0.20≤x≤0.40) by Chemical Solution Method Materials and Methods Ferroelectric (PFW$_x$-PZT$_{1-x}$) (0.20≤x≤0.40) thin films were deposited on Pt/TiO$_2$/SiO$_2$/Si(100) substrates using chemical solution deposition (CSD). The high purity (>99.9%) precursor materials (i.e., lead acetate trihydrate, iron 2-4 pentanedieonate, titanium isopropoxide, zirconium isopropoxide and tungsten isopropoxide) were bought from Alfa Aesar and used for making stock solutions. For good quality films a (PFW$_x$-PZT$_{1-x}$) (0.20≤x≤0.40) solution of 0.2-0.3 molar concentration was spin coated at 3000 rpm for 30 seconds and pyrolyzed at 673 K for 2 minutes. This process was repeated several times in order to get desired film thickness. Rapid thermal annealing (RTA) was performed at different temperatures from 873 K-1023 K for different time intervals ~60-300 seconds to get the desired phase and high density. The substrate consists of a layer of Si (about 350 μm thick), SiO$_2$ (about 0.6 μm thick), TiO$_2$ (about 0.1 μm thick) and Pt (about 0.15 μm thick). The films are deposited on a substrate which is approx. 300 nm thick.

DC sputtering was carried out for depositing the Pt top electrode of 3.1×10$^{-4}$ cm$^2$ area using a shadow mask. The dielectric properties in the frequency range of 100 Hz to 1 MHz were studied using an impedance analyzer HP4294A over a wide range of temperature attached to a temperature controlled probe station. Magnetic properties were investigated using a vibrating sample magnetometer (VSM). The polarization versus electric field (P-E) hysteresis loop of the capacitor was measured using the RT 6000HVS ferroelectric tester (Radiant technology) operating in virtual ground mode.

Results

X-ray diffraction patterns (XRD) of the (PFW$_x$-PZT$_{1-x}$) (0.20≤x≤0.40) thin films deposited on Pt/TiO$_2$/SiO$_2$/Si substrates at 673 K and post-annealed at 1023 K for 60 seconds, continuously further annealed at 923 K for 180 seconds for better homogeneity and crystallinity. In order to get the desired phase, several temperatures were chosen for RTA; the compositions listed provide the best single-phase compound at each annealing temperature. The XRD analysis indicates that the films grown at 973 K were single-phase polycrystalline in nature with less than 1% impurities (pyrochlore) phases. The synthesized complex single-phase perovskite possesses more than five elements in the perovskite octahedra, which makes it very unlikely to get a 100% pure phase, but the electrical properties of all the films having less than 5% pyrochlore were excellent, giving very similar polarizations and electrical responses.

Figure 2:
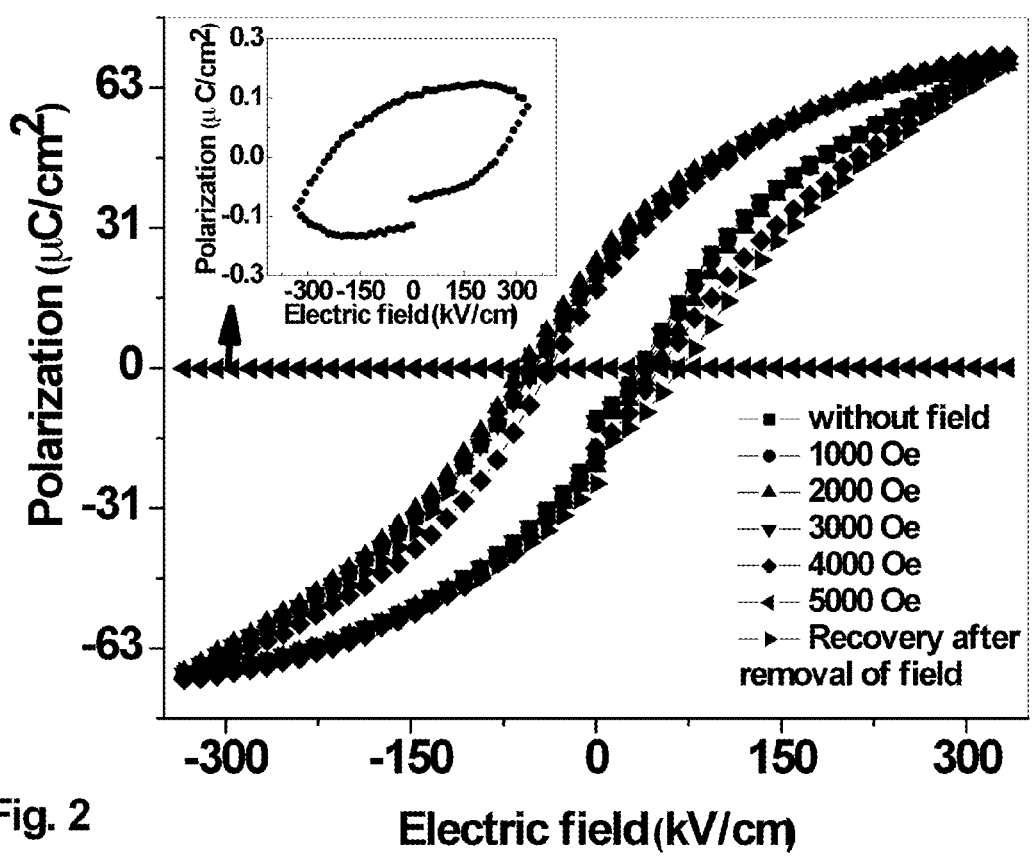
FIG. 2 shows a plot of Three-state logic switching (+P, O, $-P_r$) in 0.2 PFW/0.8PZT, according to the present invention.

These exhibit ferroelectricity and (weak) ferromagnetism above room temperature with strain coupling via electrostriction and magnetostriction. Application of modest magnetic field strength ($\mu_0$H<1.0 Tesla) destabilizes the long-range ferroelectric ordering and switches the polarization from ca. 22 μC/cm$^2$ (0.22 C/m$^2$) to zero (relaxor state) as shown in FIG. 2. This offers the possibility of three-state logic (+P, 0, −P) and magnetically switched polarizations. Because the switching is of large magnitude (unlike the very small nC/cm$^2$ values in terbium manganites) and at room-temperature, commercial devices should be possible.

Figure 3:
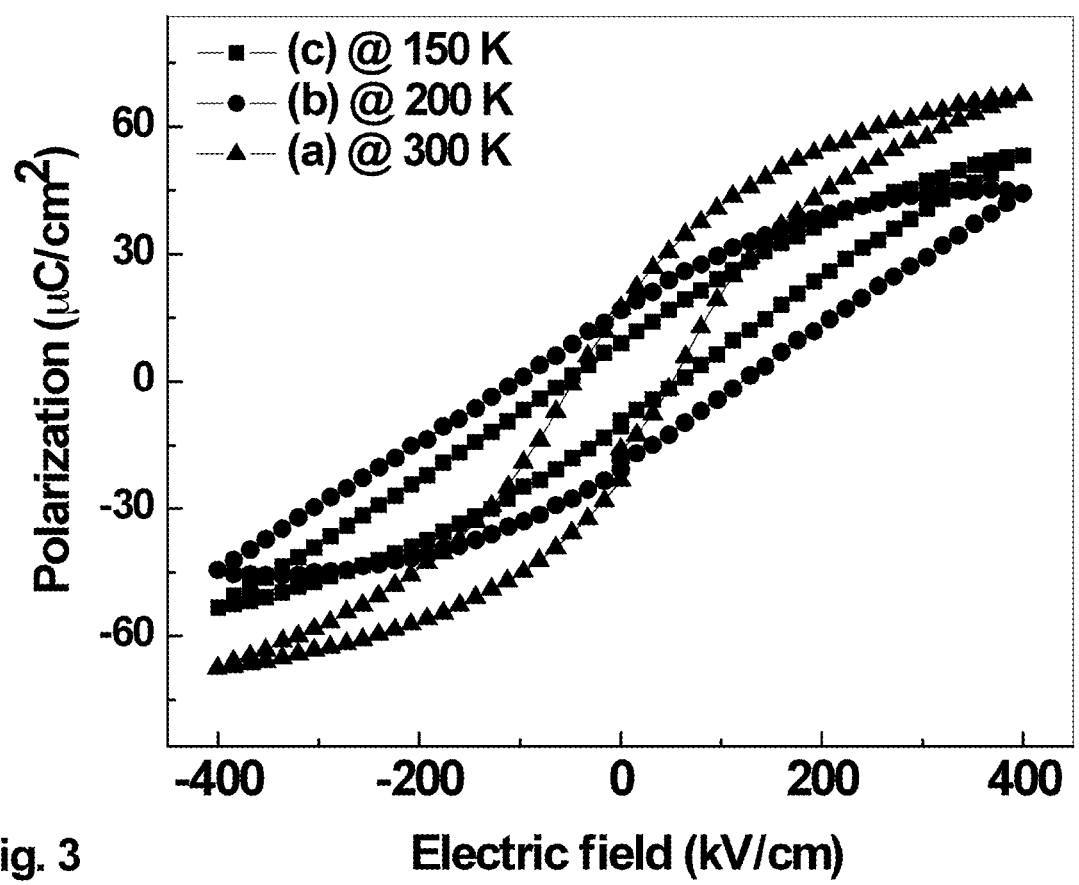
FIG. 3 shows a plot of Polarization vs. electric field hysteresis loops for sol-gel derived ($PFW_x$-$PZT_{1-x}$) ($x=0.20$ (a), $x=0.30$ (b), and $x=0.40$ (c)) at 300 K, 200 K and 150 K respectively, according to the present invention.
Figure 4:
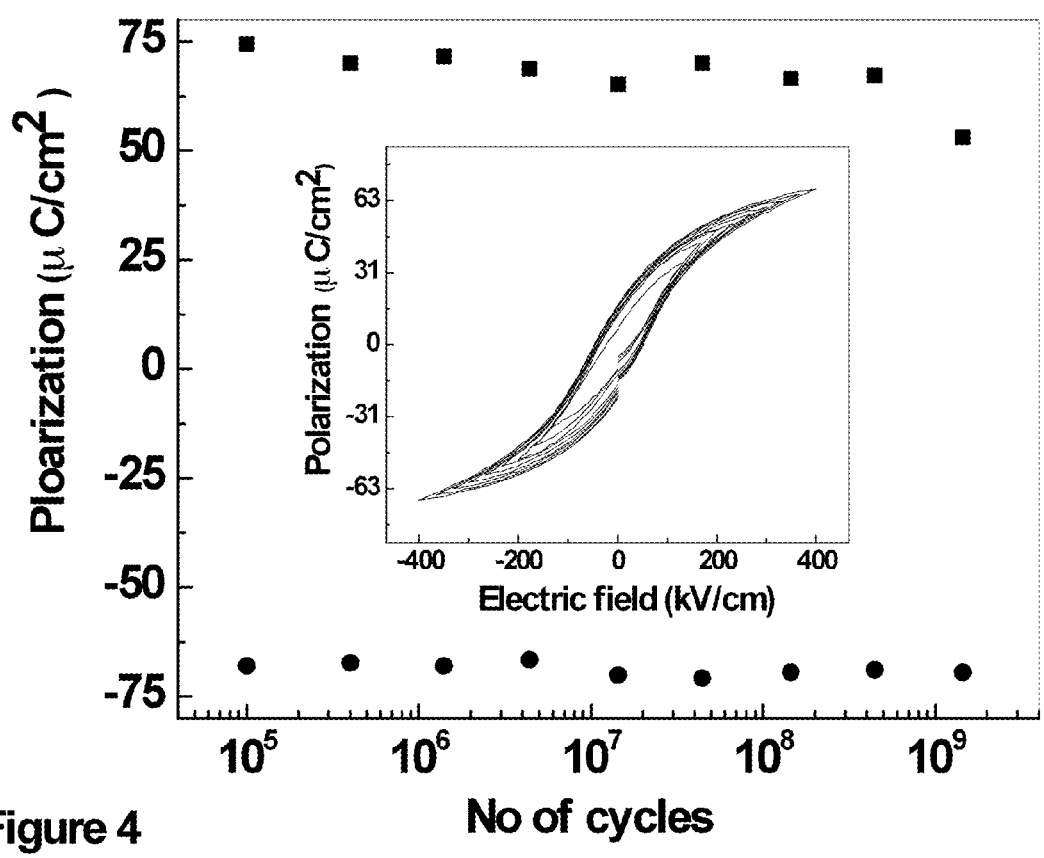
FIG. 4 shows a plot of Fatigue behavior of the films with 100 kHz bipolar square waves in the presence of 350 kV/cm external electric field over 109 cycles, according to the present invention.

The electric-field-induced polarization switching (P-E) behavior was studied at low frequency at 50 Hz using Sawyer-Tower measurements. FIG. 3 shows the ferroelectric hysteresis loops for (PFW$_x$-PZT$_{1-x}$) (x=0.20 (a), x=0.30 (b), and x=0.40 (c)) at 300 K, 200 K and 150 K respectively. The films exhibit well saturated hysteresis loops with remanent polarization (P$_r$) of about 22, 20, and 11 μC/cm$^2$ and coercive field of 47 kHz, 64 kHz, and 111 kHz respectively for (a), (b) and (c) under 400 kV/cm applied external electric field. Enhancement in remanent polarization may be attributed to the relaxed local strain (due to larger grains) and/or greater compositional. In order to check the real-time polarization behavior of (PFW$_x$-PZT$_{1-x}$) (x=0.20) films and thus their utility in memory devices, fatigue tests were performed. Fatigue behavior of (PFW$_x$-PZT$_{1-x}$) thin films was studied with 100 kHz bipolar square waves in the presence of 350 kV/cm external electric field. The first fatigue data points were obtained after 10$^5$ cycles and continued until 10$^9$ cycles, as shown in FIG. 4. There was a modest polarization loss (<12%). Twelve percent decay in fatigue of (PFW$_x$-PZT$_{1-x}$) (x=0.20) thin films on a platinized silicon substrate after 10$^9$ cycles much better than the early reports for PZT, indicating its suitability for memory device applications.

Three-state logic and switching at room temperature is shown in FIG. 2. +P$_r$ to −P$_r$ switching is observed at E$_c$=48 kV/cm (1.4 V across 300 nm); and magnetic switching from +Pr to zero is shown at 0.5 Tesla. In microelectronics memory applications, it is of greater interest to switch magnetization M with electric field E than to switch polarization P with magnetic field H. The device can be placed in a dc field of H=0.49 T with only 100 Gauss required to switch. Three-state logic at a switching field of 100 Gauss could be very useful.

Figure 5:
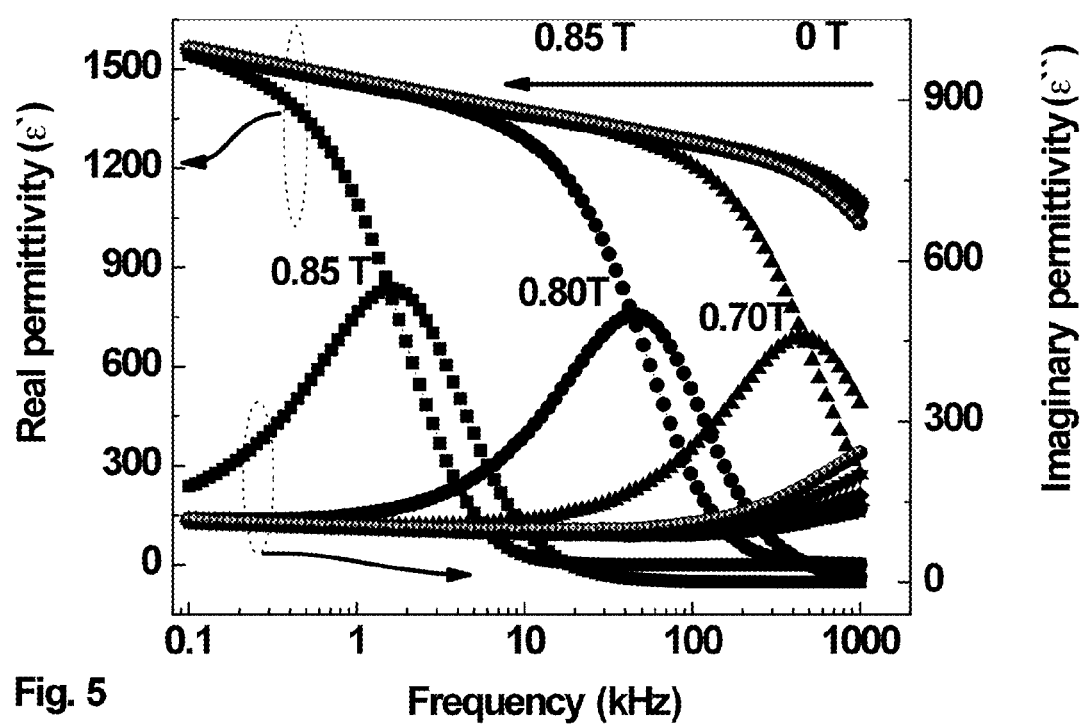
FIG. 5 shows a plot of Real and imaginary part of dielectric permittivity as function of frequencies under the application of external magnetic field from 0 to 0.85 T, according to the present invention.
Figure 6:
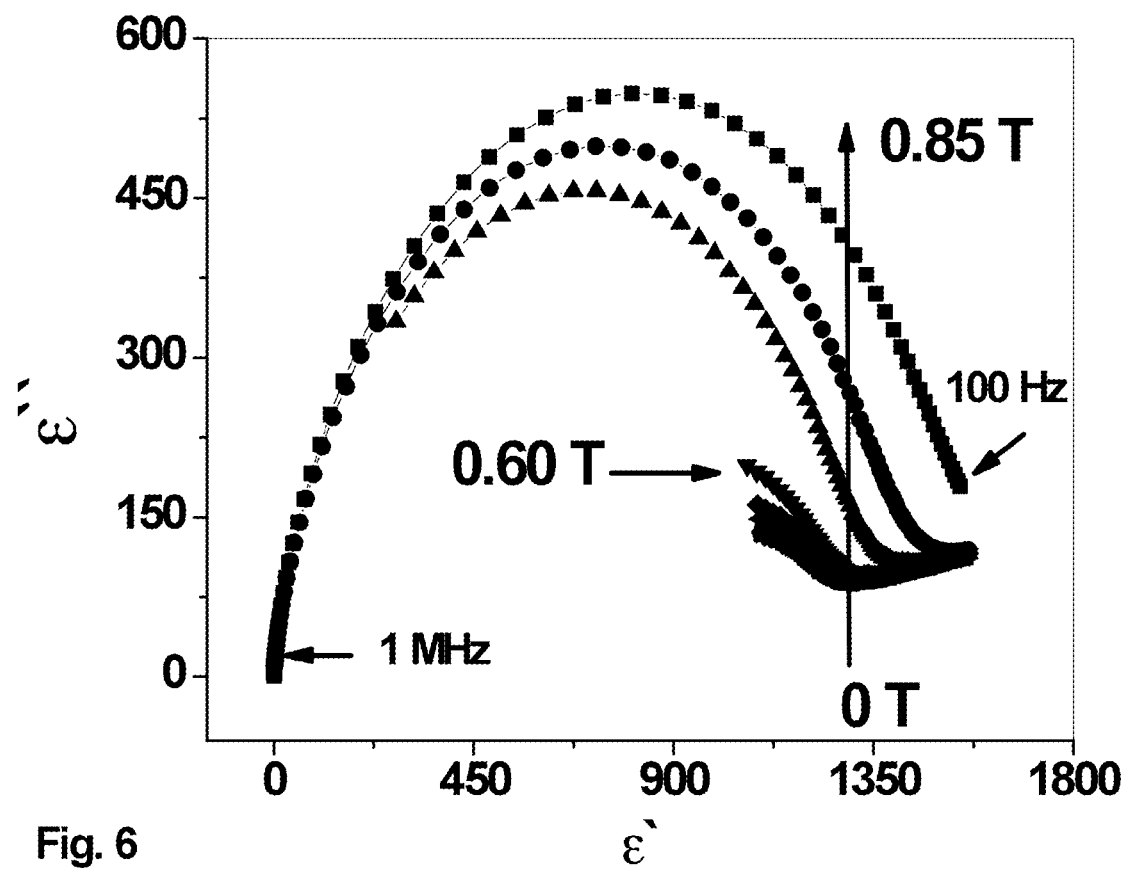
FIG. 6 shows a Cole-Cole plot of dielectric data under the action of applied magnetic field, according to the present invention.
Figure 7:
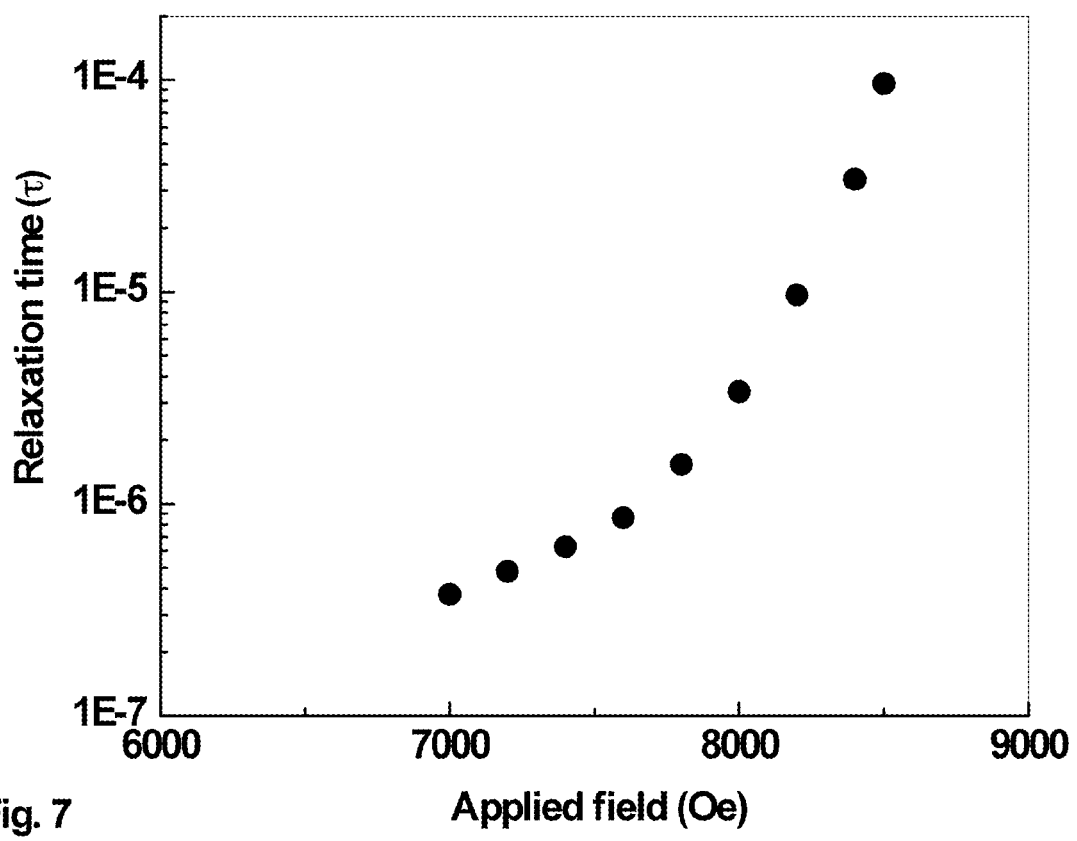
FIG. 7 shows a plot of Relaxation time as a function of applied magnetic field, according to the present invention.

The polarization response at 0.5 T is shown in the insert in FIG. 2; representing a leaky linear dielectric. The reason for this behavior is shown clearly in the plot of dielectric constant versus frequency at different magnetic fields shown in FIG. 5. At H=0.80 T, the dielectric constant is 1430 for f=1 kHz but it is 233 at f=100 kHz. This is simply due to the field dependence of the relaxation time, and the fact that as H increases the size (correlation length) of spin clusters in this magnetic relaxor increases and hence their fluctuation time decreases (in an extrapolated infinite field H, the system would have long-range ferromagnetic order and the relaxation frequency would go to zero). The fact that this strongly influences their dielectric susceptibility requires strong coupling between spin fluctuations and polarization fluctuations. FIG. 5 shows that the peak of the dielectric loss at H=0.85 T is at f=ca. 2-3 kHz. Note that this agrees with the inflection frequency of 2-3 kHz estimated from real part of permittivity, suggesting a magnetic field-induced Debye relaxation. The relaxation time obtained from the characteristic peak in dielectric loss spectra from FIG. 5 and/or from the stretched exponential parameters of FIG. 6 are plotted in FIG. 7. It indicates that increasing H lengthens the relaxation time by 500× from <200 ns to >100 μs, and it couples strongly the polarization relaxation and spin relaxations.

Figure 8:
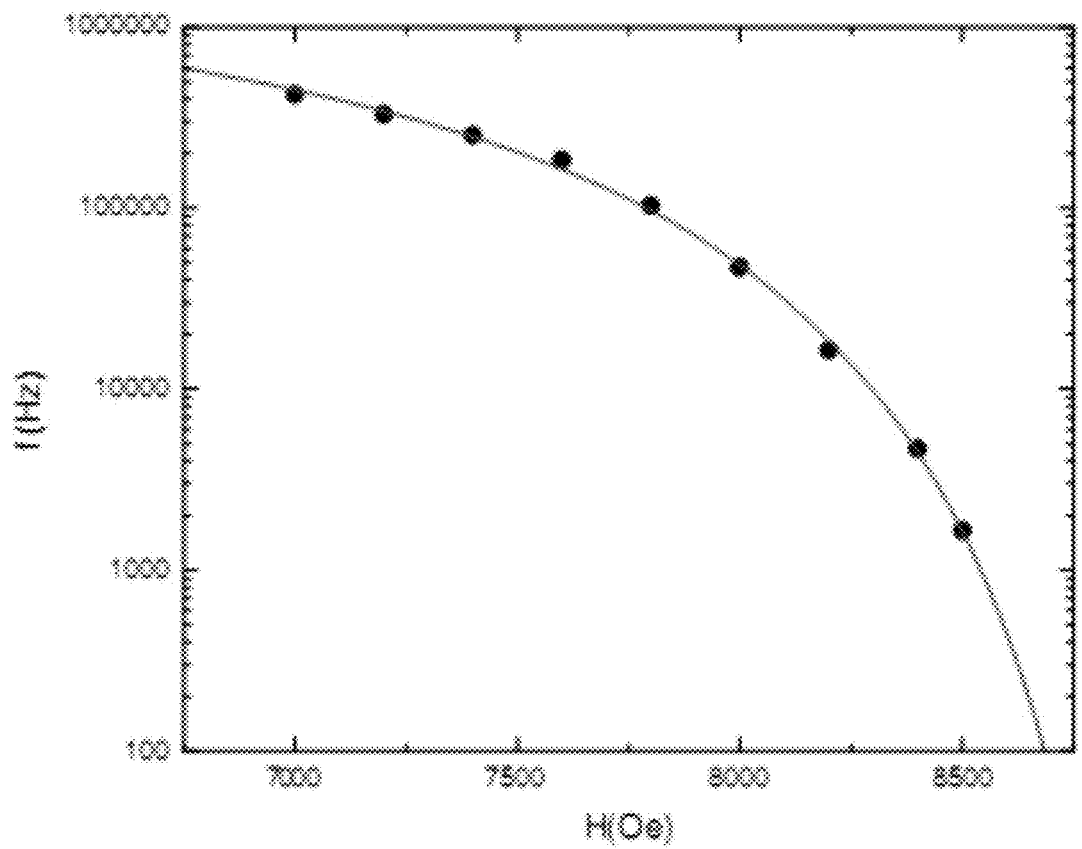
FIG. 8 shows a plot of Vogel-Fulcher-type fitting of relaxation frequency, according to the present invention.

These characteristic frequencies can be accurately fitted to high precision the Vogel-Fulcher-type equation:

$$f = f_0 \exp\left(-\frac{U_2}{H_c^2 - H_R^2} +\right) \quad (1)$$

where $H_f$ is a freezing field and replaces the analogous term in $T_f$ (freezing temperature) in the usual Vogel-Fulcher Equation; $\mu_B$ is the Bohr magneton; and $H_R$, the relaxation field. Eq. 1a arises from an $E^2H^2$ term in the free energy and is independent of the sign of H. The fitted data provide freezing field $H_c$=0.92±0.07 Tesla and characteristic frequency $f_0$=40±1 MHz as shown in FIG. 8.

Conclusions

A bigger family of room-temperature single-phase magnetoelectric multiferroic $(PZT-PFW)_x$ thin films has been synthesized by CSD techniques which shows a high dielectric constant, low dielectric loss, highly frequency-dispersive susceptibility, more than 50% temperature dependent dielectric tunability, and above-room-temperature dielectric maxima. They exhibit a ferroelectric polarization of 22 $\mu C/cm^2$ and low coercive field of 48 kV/cm with 12% fatigue in polarization after $10^9$ cycles, thus suggesting a potential candidate for memory applications. At room temperature a weak ferromagnetic/antiferromagnetic M-H hysteresis was detected which suggests an extra degree of freedom of Fe ions in complex octahedra, tilting of $Fe^{+3}$—O—$Fe^{+3}$ linkage, and charge ordering with nearest neighbors. The ferroelectric hysteresis flops under the application of external magnetic field (>0.50 T), revealing a strong magnetoelectric coupling in the present system, but this is not direct, rather it is indirect through strain via electrostriction plus magnetostriction. It is not due to a conventional magnetically-induced phase transition (instead, due to a field-dependent spin relaxation time). This new magnetoelectric effect, switching from $+P_r$ to zero with applied magnetic field, is 1000 times greater than in rare-earth manganites and occurs at room temperature, suggesting a variety of new magnetoelectric devices, including very large magneto-capacitance and three-state logic elements.

EXAMPLE 2

Preparation and Properties of $(PFW_x-PZT_{1-x})$ (0.20≤x≤0.80) by Pulsed Laser Method Materials and Methods Stoichiometric ceramic targets of $(PFW_x-PZT_{1-x})$ (0.20≤x≤0.80) with 10% excess of lead oxide (to compensate for loss of volatile Pb) were synthesized by a conventional solid-state route. Three different compositions of $(PFW_x-PZT_{1-x})$ films with varying deposition temperature were fabricated by pulsed laser deposition (PLD) employing a KrF excimer laser (λ=240 nm). The conducting $La_{0.67}Sr_{0.33}CoO_3$ (LSCO) layer was grown on MgO (100) substrate at 873 K under an oxygen pressure of 300 mTorr, using a laser energy density of (1.8 $J/cm^2$) and repetition rate of 10 Hz, followed by normal cooling in oxygen atmosphere. LSCO was used as bottom electrode for all kind of electrical measurements. The $(PFW_x-PZT_{1-x})$ layer was then deposited on the LSCO layer at 873 K under an oxygen pressure of 200 mTorr, using a laser energy density of (1.5 $J/cm^2$) and repetition rate of 10 Hz. After deposition, $(PFW_x-PZT_{1-x})$ was annealed at 873 K for 30 minutes in oxygen at a pressure of 300 Torr. Finally, the films were cooled down to room temperature at a slow rate. The total thicknesses of the films were around 350 nm. The structural analysis was done with a Siemens D500 x-ray diffractometer (Cu Kα radiation) in a θ-2θ scan. Atomic force microscopy (Veeco-AFM-contact mode) was used to examine the morphology and the surface roughness. The film thickness was determined using an X-P-200 profilometer. The electrical and room temp magnetic measurements were carried out with the same equipments as for CSD films. Temperature dependent magnetic measurements were carried out using a Quantum Design MPMS XL-7 SQUID magnetometer.

Results

XRD patterns of $(PFW_x-PZT_{1-x})$ films indicate epitaxial (cube by cube) growth along (100) directions. The peak positions were shifted towards higher Bragg angles with increase in Fe and W compositions. The full width at half maximum (FWHM) increases slightly for higher PFW percentages, indicating the local strain contribution to the FWHM is reduced by the presence of a unique crystalline orientation. Cell parameters of these films were estimated due to the limited number of peaks in XRD spectra showed tetragonal crystal structure till x~0.50. Lattice mismatch between the substrate and the films were analyzed on the basis of the in-plane epitaxial relationship $(PFW_x-PZT_{1-x})$ [100]||LSCO [100]||MgO [100]; the lattice mismatch was calculated using the equation $$\varepsilon = \frac{a_{sub} - a_{film}}{a_{sub}} \times 100, \quad (2)$$

where $\in$ is the lattice mismatch, $\alpha_{sub}$ is the lattice constant the substrate and, $\alpha_{film}$ is the lattice constant at the composite. A tensile strain (4.5-4.9% along the a-axis; 2.3-2.9% along the c-axis) and compressive strain (−4.9 to −4.5% along the a-axis, −7.3 to −6.6% along the c-axis) was observed between the bottom electrode and the dielectric composite layer. Two oppositely-directed strains across the substrate-film and film-bottom electrode interfaces suggest qualitatively that in-plane compressive gradient strain (inhomogeneous strain) exists in these films, which may cause higher ferroelectric phase transition temperatures in PLD grown thin films, compared with the CSD specimens.

Figure 9:
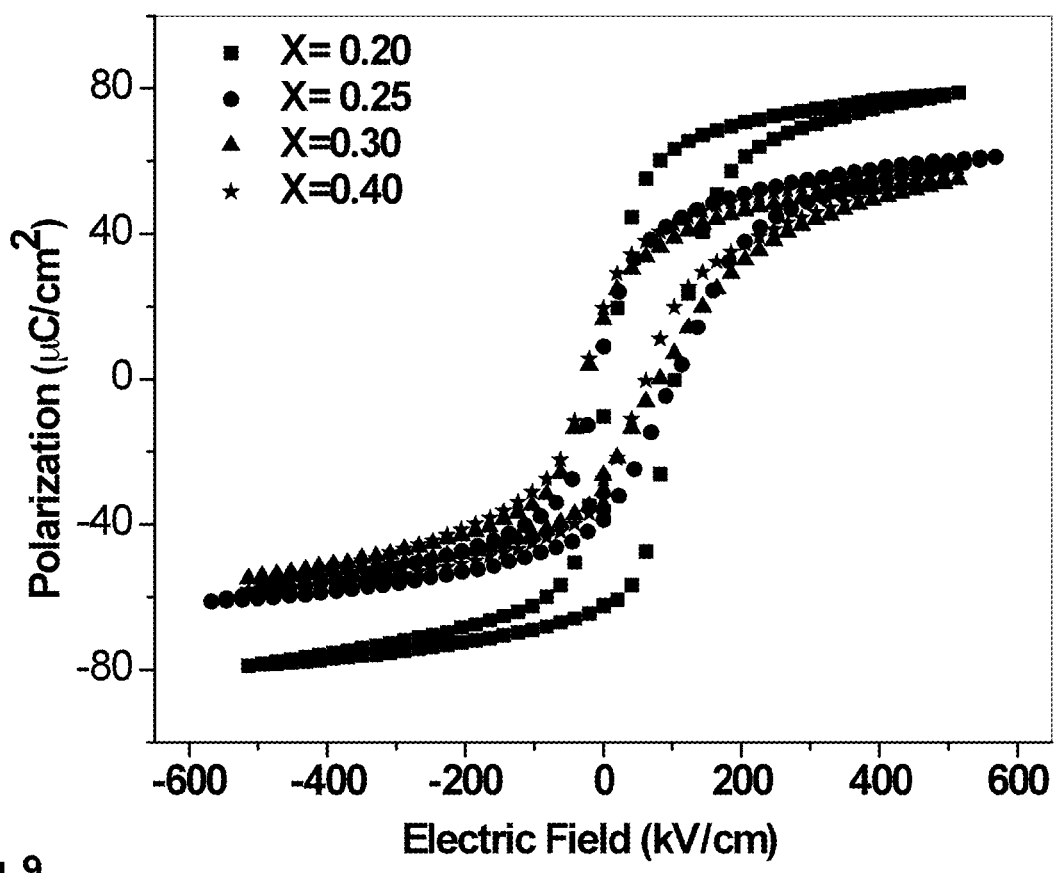
FIG. 9 shows a plot of Room temperature polarization vs. electric field hysteresis loops for PLD grown ($PFW_x$-$PZT_{1-x}$) ($x=0.20$ to 0.40 with very high polarization, well saturation and low coercive field, according to the present invention.

The electric-field-induced polarization study was carried out at very low operating frequency ~50 Hz using Sawyer-Tower circuit. FIG. 9 shows the ferroelectric hysteresis loops of PLD grown $(PFW_x-PZT_{1-x})$ (x=0.20 to 0.40) at room temperature (297 K) respectively. These films exhibit well saturated hysteresis loops with high remanent polarization $(P_r)$ of about 55-35 $\mu C/cm^2$ at 550 kV/cm external electric field, the remanant polarization decrease with increasing Fe and W composition.

Figure 10:
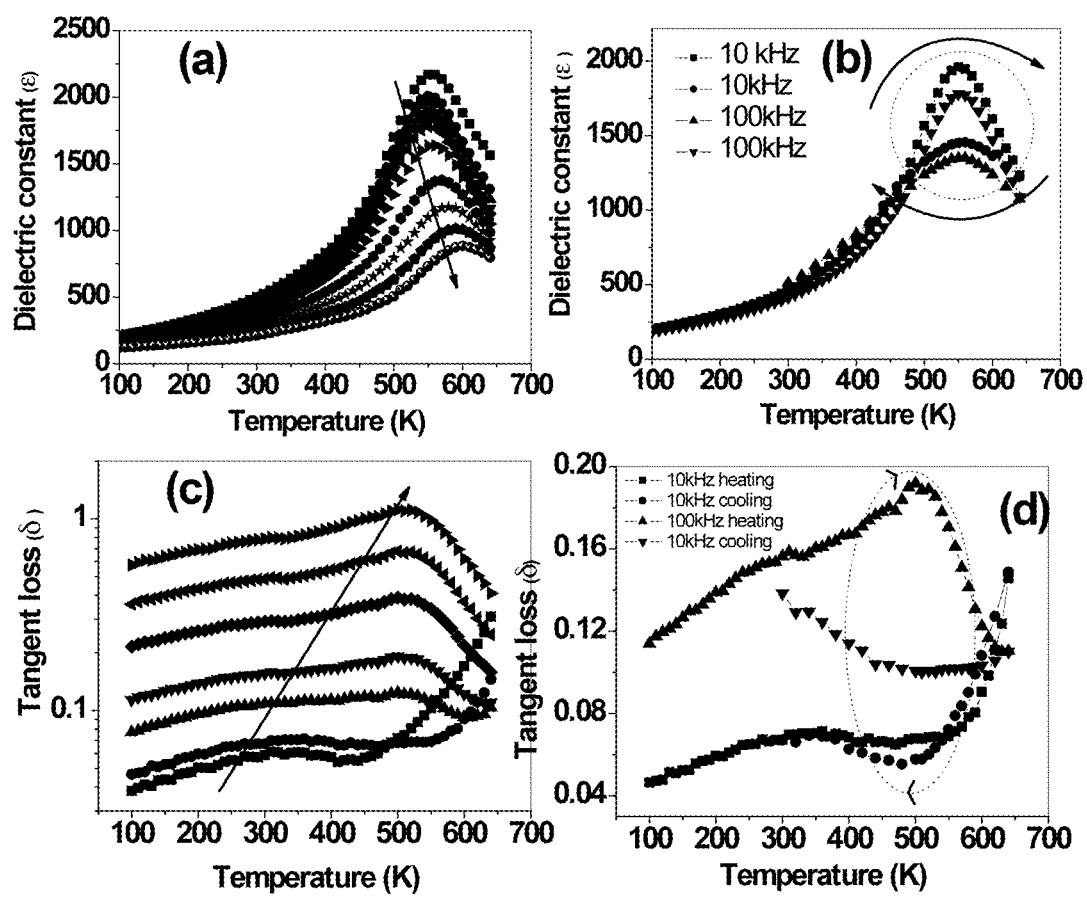
FIG. 10 shows plots of Temperature dependent PLD grown ($PFW_x$-$PZT_{1-x}$) ($x=0.20$), according to the present invention.

The temperature and frequency dependence of $(PFW_x-PZT_{1-x})$ (x=0.20) are shown in FIG. 10 which shows frequency-independent dielectric peaks $(\in_{max})$ at 550 K from 100 Hz to 10 kHz and a 40 K shift in $\in_{max}$ temperature for higher frequencies (up until 1 MHz). These observations reveal strain-induced relaxor ferroelectric properties. The tangent loss shows the character typical of relaxor materials: loss increases with increase in applied frequency. The frequency dispersion in the dielectric constant does not follow that of classical relaxor materials, but instead is more similar to that of impurity-induced relaxor materials like $Ba_{1-x}Sr_x$-$TiO_3$ and $SrBi_2Nb_2O_9$. $SrBi_2Nb_2O_9$ can be tuned as a relaxor ferroelectric by doping with Ba, Sr, or Ce ions. A huge frequency dispersion in the dielectric spectra below and above the ferroelectric phase transition is noticed with extra energy storage capacity during the heating and cooling process. Similar phenomena were observed in the loss-tangent spectra. Heating and cooling effects on the dielectric constant and loss spectra at selected frequencies (10 kHz and 100 KHz) are shown in FIG. 10, (b) and (d).

The most striking features of increased Fe and W compositions in ($PFW_x$-$PZT_{1-x}$) are as follows: (i) the ferroelectric phase transition temperature shifts towards room temperate; (ii) ferroelectric relaxor behavior (e.g., frequency dispersion) increases; (iii) energy storage capacity increases; (iv) more temperature hysteresis for $T_c$ upon heating and cooling; (v) loss tangent increases with increase in ratio of Fe and W compositions in solid solutions of ($PFW_x$-$PZT_{1-x}$).

Figure 11:
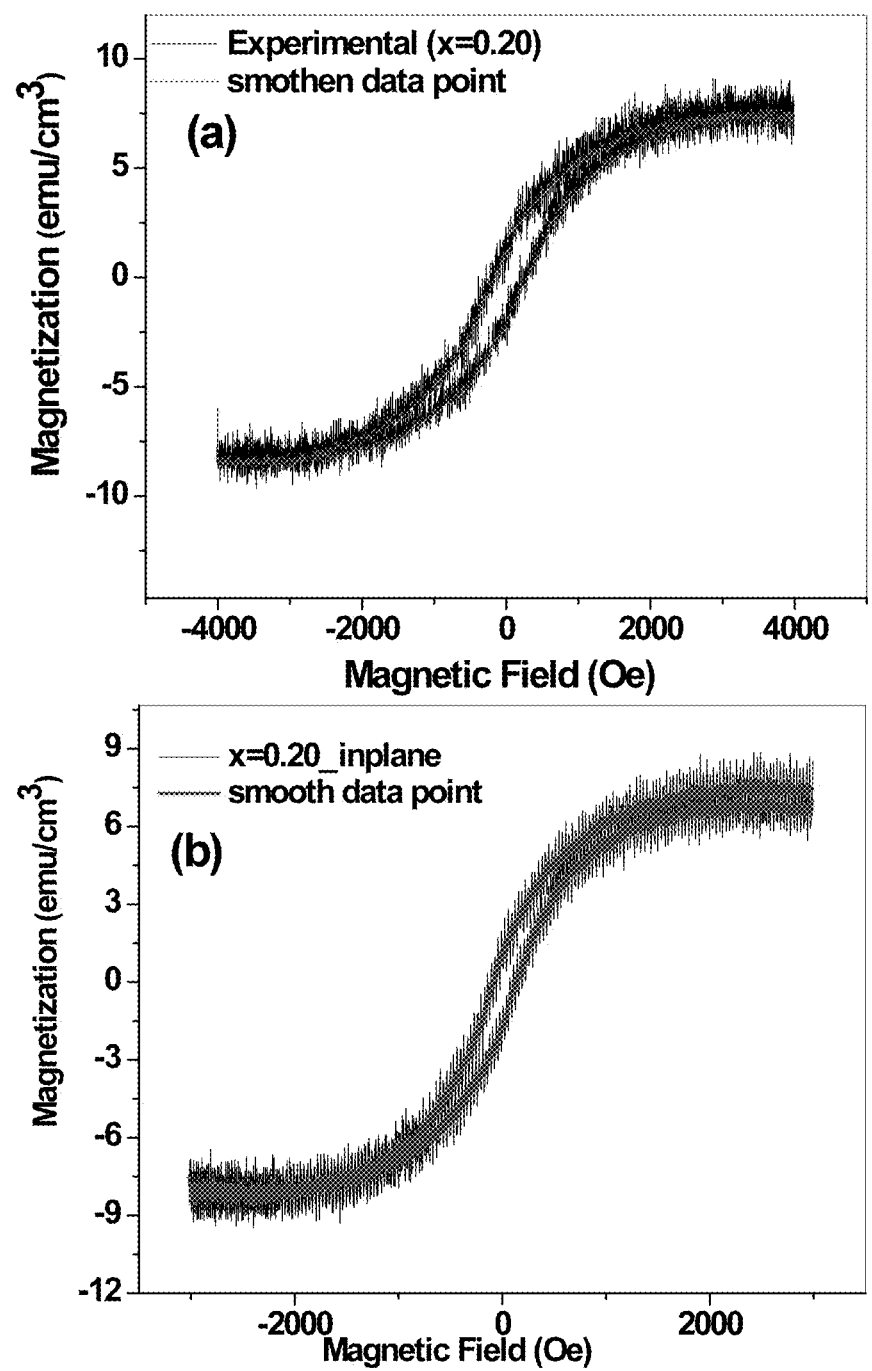
FIG. 11 shows plots of Room temperature magnetization versus magnetic field (M-H) response of the PLD grown ($PFW_x$-$PZT_{1-x}$) ($x=0.20$) thin films (a) in plane magnetization, (b) out of plane i.e. magnetization along c-axis, according to the present invention.

The magnetization versus applied field (M-H) characterization of ($PFW_x$-$PZT_{1-x}$) (x=0.20) films performed for in-plane and out-of-plane field directions is shown in FIG. 11. The induced magnetization values were between 6-8 emu/cc at 4 kOe magnetic field. M(H) along the c-axis showed well saturated ferromagnetic hysteresis with 2-3 emu/cc remanent magnetization and 230 Oe coercive field. The in-plane M(H) curve displayed a small opening (hysteresis) $H_0$=2500e coercive field. The origin of magnetism can be explained in light of the presence of $d^n$ ions at B-site which may provide in-plane ferromagnetism. The magnetization of ($PFW_x$-$PZT_{1-x}$) (x=0.20) is better and well defined compare to same composition prepared by CSD techniques; this may be due to inhomogeneous (gradient) compressive strain in the films which cause a small distortion in the $Fe^{+3}$—O—$Co^{+3}$ spin angle, producing room-temperature ferromagnetism via spin canting. Super-exchange in the disordered regions through $Fe^{+3}$—O—$Fe^{+3}$ is expected to yield antiferromagnetic ordering; there is a possibility of strong magneto-electric coupling, suggesting the converse effect of our earlier report—viz., electric fields E controlling the magnetic properties at both mesoscopic and microscopic scale.

Conclusions:

A large family of room-temperature magnetoelectric mutiferroic devices has been designed at by tailoring compositions of ($PFW_x$-$PZT_{1-x}$) at the B-site. It is found that with suitable compositions, both ferroelectric and ferromagnetic phase transition temperatures can be made to coincide near room temperature, which will be of great interest for devices and basic physics. Ferroelectricity diminished whereas relaxor behavior and anti/ferromagnetism improved with increase in FeW/ZrTi ratios. The temperature of the dielectric maximum temperature shifted strongly to lower temperatures with increase in Fe and W percentages. The ferroelectric phase transition temperatures in PLD films are higher than that of CSD specimens with the same nominal compositions, most likely attributable to in-plane gradient compressive strain. The ferro/antiferromagnetic/magnetic relaxor properties of PLD films are better that those CSD films. The basic properties of these multiferroics promise a bright future for room-temperature magnetoelectrics having both ferroic phase transitions at ambient temperature, despite the fact that their magnetoelectric coupling is nonlinear.

EXAMPLE 3

Fabrication of MMIS Device Structure of ($PFW_x$-$PZT_{1-x}$) (0.20≤x≤0.40) on p-Type Silicon Materials and Methods:

To fabricate the MMIS structure, 6 nm $SrTiO_3$ (ST) was deposited on a p-type Si(111) substrate by PLD technique. Attempts at fabrication of the structure by depositing amorphous $SrTiO_3$ at low temperatures yielded much higher leakage currents, in turn giving unsaturated accumulation regions under the application of negative bias voltage. So instead crystalline $SrTiO_3$ (6 nm) was grown at 973 K with 100 mTorr of oxygen atmosphere. Three different compositions of ($PFW_x$-$PZT_{1-x}$) films with varying deposition temperature were fabricated by PLD employing a KrF excimer laser (λ=240 nm). The ($PFW_x$-$PZT_{1-x}$) layer was then deposited on the ST layer at 600° C. under an oxygen pressure of 200 mTorr, using a laser energy density of (1.5 $J/cm^2$) and repetition rate of 10 Hz. After deposition the ($PFW_x$-$PZT_{1-x}$) was annealed at 873 K for 30 minutes in oxygen at a pressure of 300 Torr. Finally the films were cooled down to room temperature at a rate of 5 K/min. The total thicknesses of the films were around 350 nm. All other structural and electrical characterizations were done similar to previous example.

Figure 13:
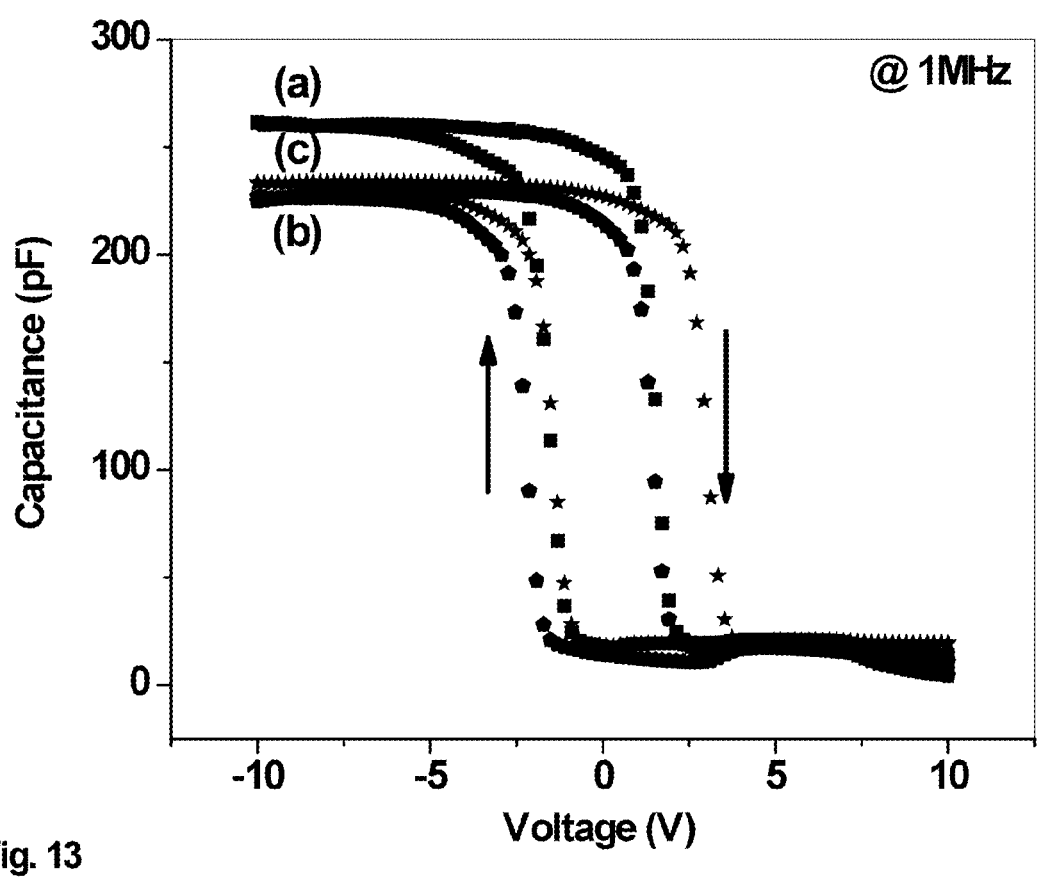
FIG. 13 shows a plot of High frequency C(V) characteristics of Pt/($PFW_x$-$PZT_{1-x}$)/$SrTiO_3$/(111)Si MMIF structures for different compositions of PFWx: (a) $x=0.20$, (b) $x=0.30$, (c) $x=0.40$, according to the present invention.

Results:

Crystal structure of ($PFW_x$-$PZT_{1-x}$) thin films on high k-$SrTiO_3$ (6-nm) coated p-Si (111) substrate showed a good single-phase tetragonal material of perovskite structure. The MMIS structure fabricated in the above example can be represented by FIG. 12 and for the present example the high k dielectric shown in the figure is $SrTiO_3$. FIGS. 13 (a), (b), (c) show memory window data as functions of sweep voltage at 1 MHz operating frequency. Curve (a) is for 20% PFW; (b) is 30% PFW; (c) is 40% PFW. A large window of ca. 4.0V is observed for the 40% PFW sample. The capacitance (C)-voltage (V) curve is similar to that of a normal metal-oxide-semiconductor (MOS) structure, clearly showing regions of accumulation, depletion, and inversion. It should be remember that all these compositions show very large polarization and low coercive field, as presented in our earlier reports. The figure displays large clockwise C-V hysteresis and a memory window controlled by ferroelectric hysteresis of the ($PFW_x$-$PZT_{1-x}$) on the Si surface. The memory window of ($PFW_x$-$PZT_{1-x}$) as function of sweep voltage with an almost negligible memory window below −3 V sweep voltage, saturated C-V hysteresis until −10V, above which gate voltage the MMIS structure started leaking during the DOWN sweep, whereas during the UP sweep (in gate voltage) accumulation regions showed good saturation. These observations indicate that the materials have high potential for RAM applications.

Figure 14:
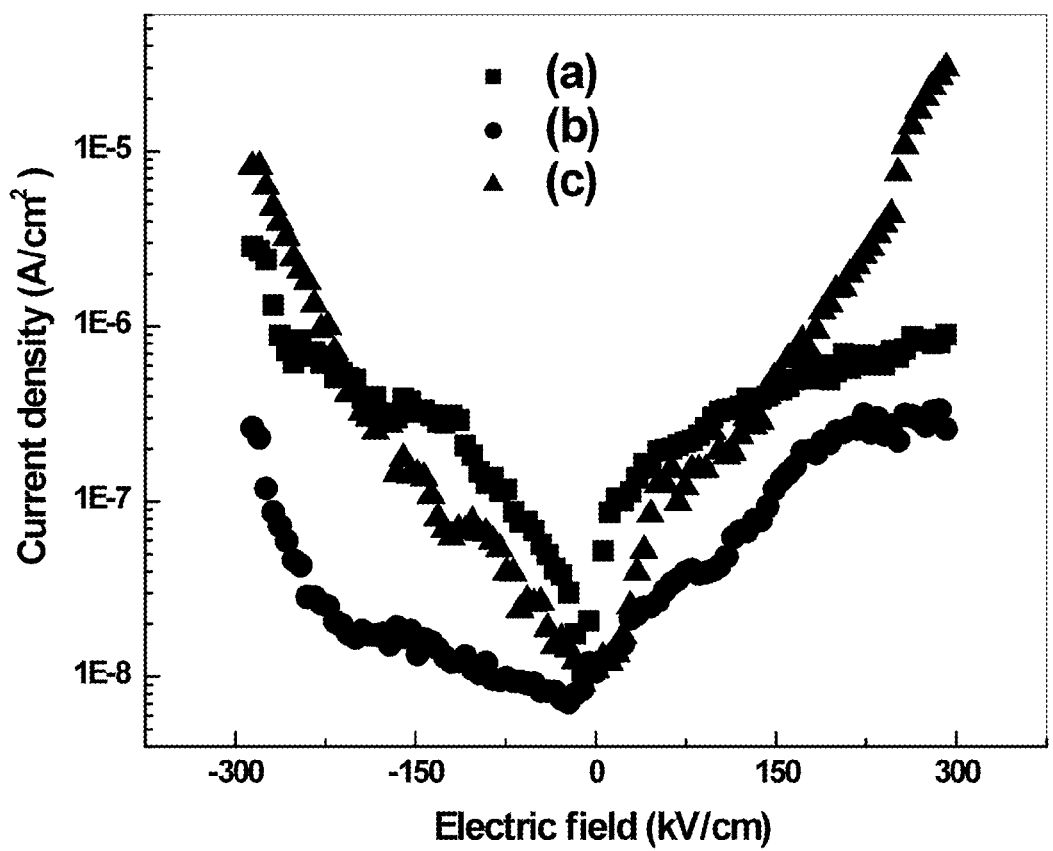
FIG. 14 shows plots of Room temperature J(E) characteristics of Pt/($PFW_x$-$PZT_{1-x}$)/$SrTiO_3$/(111)Si MMIF structures as function of sweep gate field >150 kV/cm (>15MV/m) for different compositions of PFW, according to the present invention.

FIG. 14 shows the current density vs applied electrical field J(E) data. The specimens, as in earlier figures, are: (a) 20% PFW; (b) 30% PFW; (c) 40% PFW. All these specimens showed very low leakage current for this MMIS structure; these leakage currents are higher when the electric field is applied from the semiconductor p-Si side. Different specimens showed the same characteristic J(E) behavior of very low leakage $\sim 10^{-5}$ to $10^{-7}$ $A/cm^2$ ($10^{-9}$ to $10^{-11}$ $A/m^2$) under −10V gate voltage. Due to low leakage behavior, it is hard to distinguish leakage current differences among them; but at x=0.30 of PFW has less leakage. J(E) analysis suggest that the conduction mechanism either due to Poole-Frenkel (PF) or Schottky emission (SE).

Conclusions:

MMIS device structures of Pt/($PFW_x$-$PZT_{1-x}$)/$SrTiO_3$/Si (111) are fabricated for different compositions of PFW: (a) x=0.20, (b) x=0.30, (c) x=0.40. All these composition showed well behaved and saturated C(V) hysteresis with 3-4 V memory windows, suggesting good candidates for multiferroic RAMs. J(E) characteristics of these specimens illustrate low leakage currents at room temperature dominated by bulk-limited n-type Poole-Frenkel conduction. Energy band match-up diagram and experimental results suggest that all these specimens might provide a wide memory window and good DOWN saturation if used with alternative high band-gap and high k-dielectric materials instead of $SrTiO_3$. Since all the compounds are multiferroic in nature, under the application of external magnetic field it may be possible to destabilize the saturated gate voltage and produce more than two logic states with additional functionalities.

Although the invention has been described in conjunction with specific embodiments, it is evident that many alternatives and variations will be apparent to those skilled in the art in light of the description. Accordingly, the invention is intended to embrace all of the alternatives and variations that fall within the spirit and scope of the appended claims.

We claim:

1. A ($PFW_x$–$PZT_{1-x}$) magnetoelectric multiferroic composite comprising:
($PbFe_{0.67}W_{0.33}O_3$)$_x$ ($PbZr_{0.53}Ti_{0.47}O_3$)$_{1-x}$ where, $0.2 \leq x \leq 0.8$.

2. The composite of claim 1, wherein $0.2 \leq x \leq 0.6$.

3. The composite of claim 1, wherein x is 0.2.

4. The composite of claim 1, wherein said composite comprises a single-phase.

5. The composite of claim 1, wherein said composite has magnetic switching of 20-60 $\mu C/cm^2$ electric polarizations at a temperature of about 296 K.

6. The composite of claim 3, wherein said composite has a positive temperature coefficient of resistivity.

7. The composite of claim 1, wherein said composite has a remnant polarization in the range of about 20-60 $\mu C/cm^2$.

8. The composite of claim 1, wherein said composite has a dielectric loss in the range of about 1-5%.

9. The composite of claim 1, wherein said composite has a high dielectric constant in the range of about 1200-3000.

10. The composite of claim 1, wherein said composite has a weak saturation magnetization in the range of about 0.48-4.53 $emu/cm^3$.

11. A chemical solution method of fabricating a thin film of composite of claim 1, said method comprising:
providing a platinized silicon substrate;
spin coating a ($PFW_x$–$PZT_{1-x}$) solution on said substrate;
pyrolyzing the spin coated substrate at a temperature in the range of about 673-773 K; and
repeating the steps of spin coating and pyrolyzing to obtain a film having thickness in the range of about 300-500 nanometers.

12. The method of claim 11, wherein said platinized silicon substrate is a $Pt/TiO_2/SiO_2/Si(100)$ layered substrate.

13. The method of claim 11, wherein said ($PFW_x$–$PZT_{1-x}$) solution has a concentration in the range of about 0.2-0.3 moles per liter.

14. The method of claim 11, further comprising the step of rapid thermal annealing at temperatures in the range of about 873-1023 K for about 60-300 seconds.

15. The method of claim 14, wherein the step of annealing is carried out in at least two steps of annealing at a temperature of about 973 K for about 30 seconds followed by annealing at about 923 K for about 150 seconds.

16. A pulsed laser method of fabricating a thin film of composite of claim 1, said method comprising:
providing ceramic targets of ($PFW_x$–$PZT_{1-x}$) ($0.20 \leq x \leq 0.80$);
depositing a ($PFW_x$–$PZT_{1-x}$) layer from the ceramic target on a substrate;
annealing the deposited ($PFW_x$–$PZT_{1-x}$) layer at about 873 K for about 30 minutes in oxygen at a pressure of about 300 Torr; and
cooling the annealed layer to about 296 K at a rate of about 5 K per min.

17. The method of claim 16, wherein the ($PFW_x$–$PZT_{1-x}$) layer is deposited from the ceramic target at a temperature of about 873 K under an oxygen pressure of about 200 mTorr, using a laser energy density in the range of about 1.0-1.5 $J/cm^2$ at a repetition rate of about 5-10 Hz.

18. The method of claim 16, wherein the substrate is selected form the group consisting of: MgO (100), ($LaAlO_3$)$_{0.3}$—($Sr_2AlTaO_6$)$_{0.7}$ (100) or $SrTiO_3$.

19. The method of claim 16, wherein the substrate is covered with a conducting layer of $La_{0.67}Sr_{0.33}CoO_3$ (LSCO) having a thickness in the range of about 60-90 nm.

20. The method of claim 16, wherein the total thickness of the film of composite is at least 350 nm.

21. The composite of claim 1, wherein said composite is used in at least one of: magnetic field sensors, and capacitors.

22. A memory device structure comprising at least one layer of the composite of claim 1, wherein said layer is sandwiched between at least one layer of a high-k dielectric material and a metal electrode.

23. The memory device of claim 22, comprising a memory window ranging from about 2-4 V and a leakage current density in the range of about 10-9 to bout 10-6 $A/cm^2$.

24. The memory device of claim 22, wherein said high-k dielectric material comprise at least one of: $SrTiO_3$, $HfO_2$, $DyScO_3$, and $LaGdO_3$.

25. The memory device of claim 22, wherein said metal electrode comprises one of: Pt and Au.

26. The memory device of claim 22, wherein the layer of high-k dielectric is about 2-8 nm thick.

27. A method of fabricating a memory device structure comprising:
providing a p-type Si substrate;
depositing at least one layer of a high-k dielectric material on said substrate, wherein the dielectric layer is about 2-8 nm thick; and
depositing at least one layer of a ($PFW_x$–$PZT_{1-x}$) composite of composition, ($PbFe_{0.67}W_{0.33}O_3$)$_x$ ($PbZr_{0.53}Ti_{0.47}O_3$)$_{1-x}$ where, $0.2 \leq x \leq 0.8$, on said dielectric layer, wherein the composite layer is about 350 nm thick.

28. The method of claim 27, wherein the high-k dielectric material is selected from a group comprising at least one of: $SrTiO_3$, $HfO_2$, $DyScO_3$, and $LaGdO_3$.

29. The method of claim 27, wherein the high-k dielectric layer is about 2-8 nm thick.

30. The method of claim 27, wherein said dielectric layer is deposited on said substrate by pulsed laser deposition at a temperature in the range of about 973-1073 K in an oxygen atmosphere at a pressure in the range of about 50-100 mT.

31. The method of claim 27, wherein the step of depositing ($PFW_x$–$PZT_{1-x}$) composite layer on the dielectric layer comprises:
irradiating the composite layer with a laser radiation under an oxygen pressure of about 200 mTorr at a temperature of about 873 K;
annealing the irradiated composite layer at a temperature of about 873 K for about 30 min in an oxygen atmosphere at a pressure of about 300 Torr; and cooling to room temperature at a rate of about 5 K/min.

\* \* \* \* \*